United States Patent [19]

Tanaka

[11] Patent Number: 5,572,334
[45] Date of Patent: Nov. 5, 1996

[54] VARIABLE-LENGTH CODING DEVICE

[75] Inventor: Nobuyuki Tanaka, Tokyo, Japan

[73] Assignee: NEC Corporation, Tokyo, Japan

[21] Appl. No.: 358,514

[22] Filed: Dec. 19, 1994

[30] Foreign Application Priority Data

Dec. 20, 1993 [JP] Japan .................. 5-320475

[51] Int. Cl.[6] ........................................ H04N 1/41
[52] U.S. Cl. .................. 358/426; 358/261.1; 358/261.4
[58] Field of Search ........................ 358/426, 427, 358/261.1, 261.4; 341/60, 63, 67

[56] References Cited

U.S. PATENT DOCUMENTS

| | | | |
|---|---|---|---|
| 4,495,639 | 1/1985 | Mosier et al. | 341/63 |
| 4,701,745 | 10/1987 | Waterworth | 341/63 |
| 5,146,220 | 9/1992 | Ishikawa | 341/60 |
| 5,363,098 | 11/1994 | Antoshenkov | 341/63 |
| 5,436,626 | 7/1995 | Fujiwara et al. | 341/63 |

FOREIGN PATENT DOCUMENTS

| | | | |
|---|---|---|---|
| 5357576 | 4/1984 | Japan . | |
| 59-57576 | 4/1984 | Japan | H04N 1/41 |

Primary Examiner—Scott A. Rogers
Assistant Examiner—Thomas L. Stoll
Attorney, Agent, or Firm—Sughrue, Mion, Zinn, Macpeak & Seas

[57] ABSTRACT

A variable-length coding device for compressing video data includes a variable-length code memory, which stores predefined and pre-shifted variations of variable-length codes in entries thereof. Each entry also has two counter fields, one for indicating the number of combined data bytes to be written to a compressed data memory, and another for indicating the number of valid bits remaining in the final byte written to the compressed data memory. The variable-length coding device does not require shifting of variable-length codes at storage time, and realizes an increase in efficiency.

4 Claims, 5 Drawing Sheets

Fig. 1

| | | | | | | | |
|---|---|---|---|---|---|---|---|
| A | A | A | A | A | A | A | A |
| A | A | A | A | A | A | A | A |
| A | A | A | A | A | A | A | A |
| A | A | A | O | O | O | O | O |
| O | O | O | O | O | O | O | O |

Fig. 4

| | C | R |
|---|---|---|
| XXXXXXXX XXXXXXXX XX000000 00000000 00000000 | 00010000 | 00010010 |
| 0XXXXXXX XXXXXXXX XXX00000 00000000 00000000 | 00010001 | 00010011 |
| 00XXXXXX XXXXXXXX XXXX0000 00000000 00000000 | 00010010 | 00010100 |
| 000XXXXX XXXXXXXX XXXXX000 00000000 00000000 | 00010011 | 00010101 |
| 0000XXXX XXXXXXXX XXXXXX00 00000000 00000000 | 00010100 | 00010110 |
| 00000XXX XXXXXXXX XXXXXXX0 00000000 00000000 | 00010101 | 00010111 |
| 000000XX XXXXXXXX XXXXXXXX 00000000 00000000 | 00100000 | 01000000 |
| 0000000X XXXXXXXX XXXXXXXX X0000000 00000000 | 00110001 | 01100001 |

VARIABLE-LENGTH CODING DEVICE

BACKGROUND OF THE INVENTION

The present invention relates to a variable-length coding device for compressing video data and, more particularly, to a variable-length coding device capable of coding video data at high speed.

It has been customary, in a variable-length coding device for video data compression to read out a predefined variable-length code which matches input video data, to sequentially shift the variable-length code, one bit at a time, depending on the number of bits of remaining valid data stored in the currently used address of a compressed data memory (i.e., where the final bit of the immediately preceding variable-length code was written), and to OR the resulting shifted variable-length code with the "remaining" data to produce combined compressed data suitable for storage, beginning with the currently used address. The problem with this procedure is that it consumes a substantial period of time when the variable-length code must be shifted a number of times. Particularly, when the variable-length code has two or three bytes, the processing time is doubled or tripled. Further, since data transfer to the compressed data memory occurs on a bit-by-bit basis, it is necessary to manage the address of the last data in the memory, again increasing the processing time.

In light of the above, Japanese Patent Laid-Open Publication No. 59-57576 discloses a procedure for promoting rapid variable-length coding. The procedure taught in this Laid-Open Publication uses a counter for counting the bits of the variable-length code to be stored and controls the shift on the basis of this count. Specifically, the variable-length code is shifted, two bits at a time, from the upper bits, and then is transferred to a memory. As for the last bit, whether the count of the counter is even or odd is determined. The last bit is shifted by two bits if the count is even or by one bit if it is odd and then transferred to the memory. Such a procedure successfully reduces the number of shifts. However, when the variable-length code has, for example, a great bit length, even this procedure needs a great number of shifts. This, coupled with the fact that whether or not the number of bits is even or odd must be determined, prevents the processing time from being sufficiently reduced.

SUMMARY OF THE INVENTION

It is, therefore, an object of the present invention to provide a variable-length coding device capable of processing video data at high speed.

A variable-length coding device for compressing video data or the present invention has a first memory for storing compressed data, and a second memory for storing the pre-defined variable-length codes. Along with pre-shifted versions thereof. The second memory stores, in addition to data entries having the variable-length codes and their pre-shifted corresponding, first counts for determining, based on the respective variable length code of an entry, a code bit length of "remainder" data stored in the last used address of the first memory, and corresponding second counts for determining the particular number of bytes in which the compressed data will be written to the first memory.

BRIEF DESCRIPTION OF THE DRAWINGS

The above and other objects, features and advantages of the present invention will become more apparent from the following detailed description taken with the accompanying drawings in which:

FIG. 1 shows a specific example of compressed data already stored in a compressed data memory;

FIG. 4 shows data stored in a variable-length code memory included in the embodiment.

DESCRIPTION OF THE PREFERRED EMBODIMENT

Referring to FIG. 1 of the drawings, specific compressed data already stored in a compressed data memory are shown. In a conventional variable-length coding device for video data compression, a variable-length code which corresponds to input video data, is read. This code is sequentially shifted, one bit at a time, depending on the number of bits of valid "remaining" data already stored at the currently used (i.e., next write) address of the compressed data memory, (i.e., where the aforementioned shifted variable-length code is to be written). The shifted variable-length code and the remaining data are ORed to produce combined compressed data suitable for storage, beginning at the currently used address of the compressed data memory.

Figure 2:
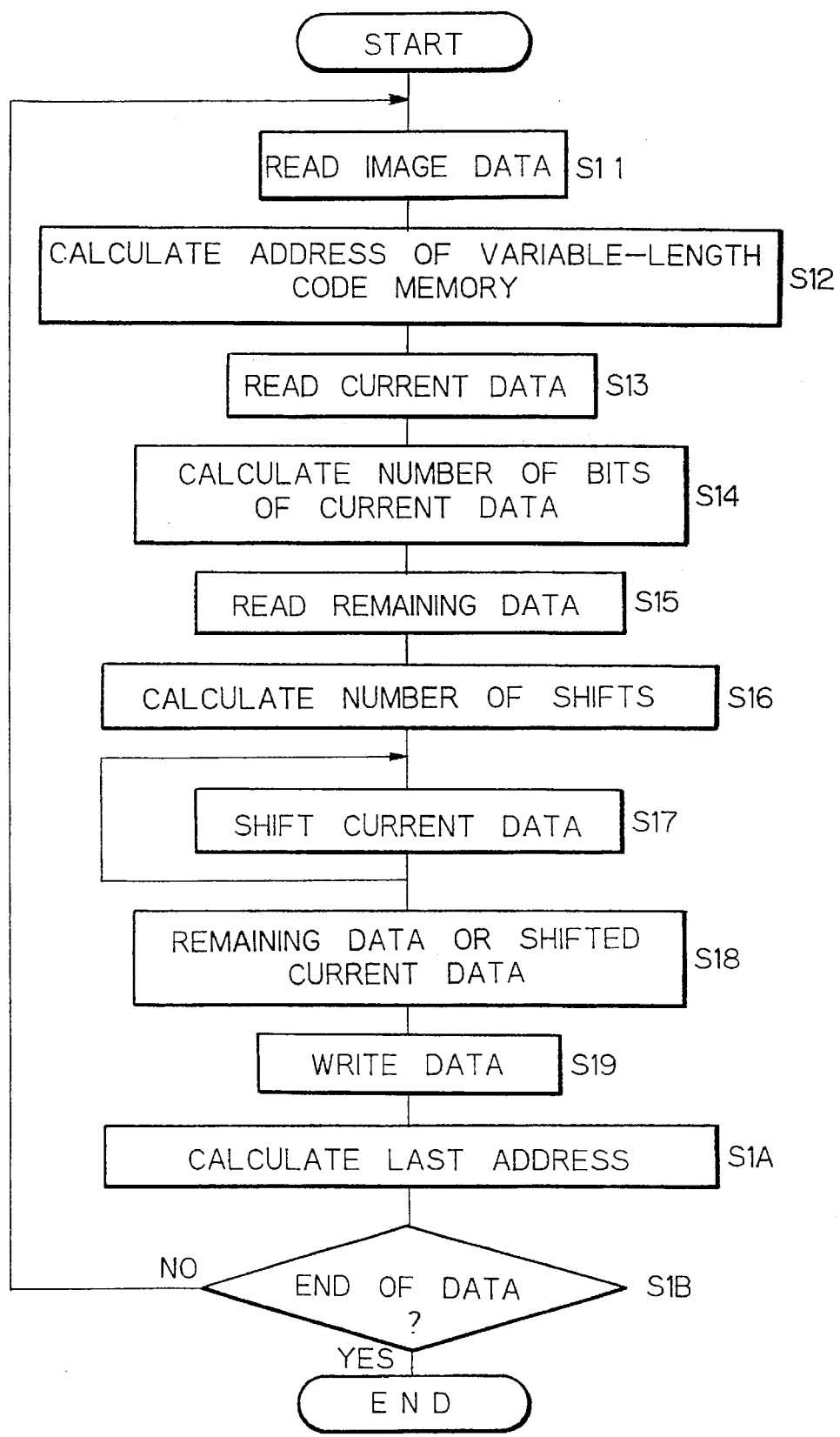
FIG. 2 is a flowchart demonstrating a specific variable-length coding procedure.

FIG. 2 shows a conventional variable-length coding procedure implementing the above concept. Assume, for example, that a variable-length code has ten bits of valid data. First, video data are read out of a file unit (step S11). The address of the memory storing pre-defined variable-length code corresponding to the video data is calculated (step S12). As a result, a ten valid bit variable-length code [XXXXXXXX XX000000] is read out of the memory as the current data (step S13). In the code, each "X" and each "0" represent valid and invalid data, respectively. Subsequently, a pre-determined value indicating the number of bits of the variable-length code (i.e., 10), and assigned thereto beforehand is calculated (step S14). Then, the remaining data in the used (i.e., next write) address of the compressed data memory [AAA00000] as shown in FIG. 1 are read out of the compressed data memory (step S15). The number of remaining bits of the remaining data [AAA00000] is detected ("3" in this example). This number ("3") indicates the number of shifts to be performed (step S16). In FIG. 1, each "A" represents valid, already stored, compressed binary data, i.e., ZERO or ONE. Subsequently, the first and second bytes of the current data are shifted to the right three times (step S17) to produce shifted current data [000XXXXX XXXXX000]. The first byte (000XXXXX) of the shifted current data and the remaining data of the currently used address of the compressed data memory (AAA00000) are ORed (step S18) to produce combined data [AAAXXXXX XXXXX000], which is suitable for storage beginning at the currently used address of the compressed data memory. These combined data are written to the compressed data memory byte by byte (step S19). To calculate the new next write address "3" (number of remaining data bits) and "10" (number of bits of the variable-length code) are summed and then modulo divided by "8" (byte length) giving "1". Hence, "1" is added to a variable indicting the currently used address of the compressed data memory, thereby showing that the address is changed by one address (step S1A). Such a procedure is repeated up to the last data file (step S1B).

Japanese Patent Laid-Open Publication No. 59-57576 teaches a variable-length coding procedure which achieves higher speed than the above conventional procedure with some additional circuitry. The procedure taught in this Laid-Open Publication uses a counter for counting the bits of a variable-length code and controls the shift on the basis of a count. Specifically, a variable-length code is shifted, two bits at a time, from the upper bits and then transferred to a memory. As for the last bit, whether the count of the counter is even or odd is determined. The last bit is shifted by two bits if the count is even or by one bit if it is odd and then transferred to the memory. The procedure disclosed in the above Laid-Open Publication successfully reduces the number of shifts. However, when the variable-length code has, for example, a great bit length, even such a procedure needs a great number of shifts. This, coupled with the fact that whether or not the number of bits is even or odd must be determined, prevents the processing time from being sufficiently reduced.

In accordance with the present invention, a variable-length code memory stores predefined entries comprising bit patterns prepared by shifting a single variable-length code. In addition, the entries of the variable-length code memory store output counts (each of which represents a particular number of bytes to be written to a compressed data memory), and remainder counts each of which indicates a particular number of remaining valid data bits left in the next write address of compressed data memory). The respective bit patterns, output counts and remainder counts are stored in the variable-length code memory in combination as data having a fixed length. This successfully eliminates the need for shifts and thereby promotes rapid variable-length coding.

Figure 3:
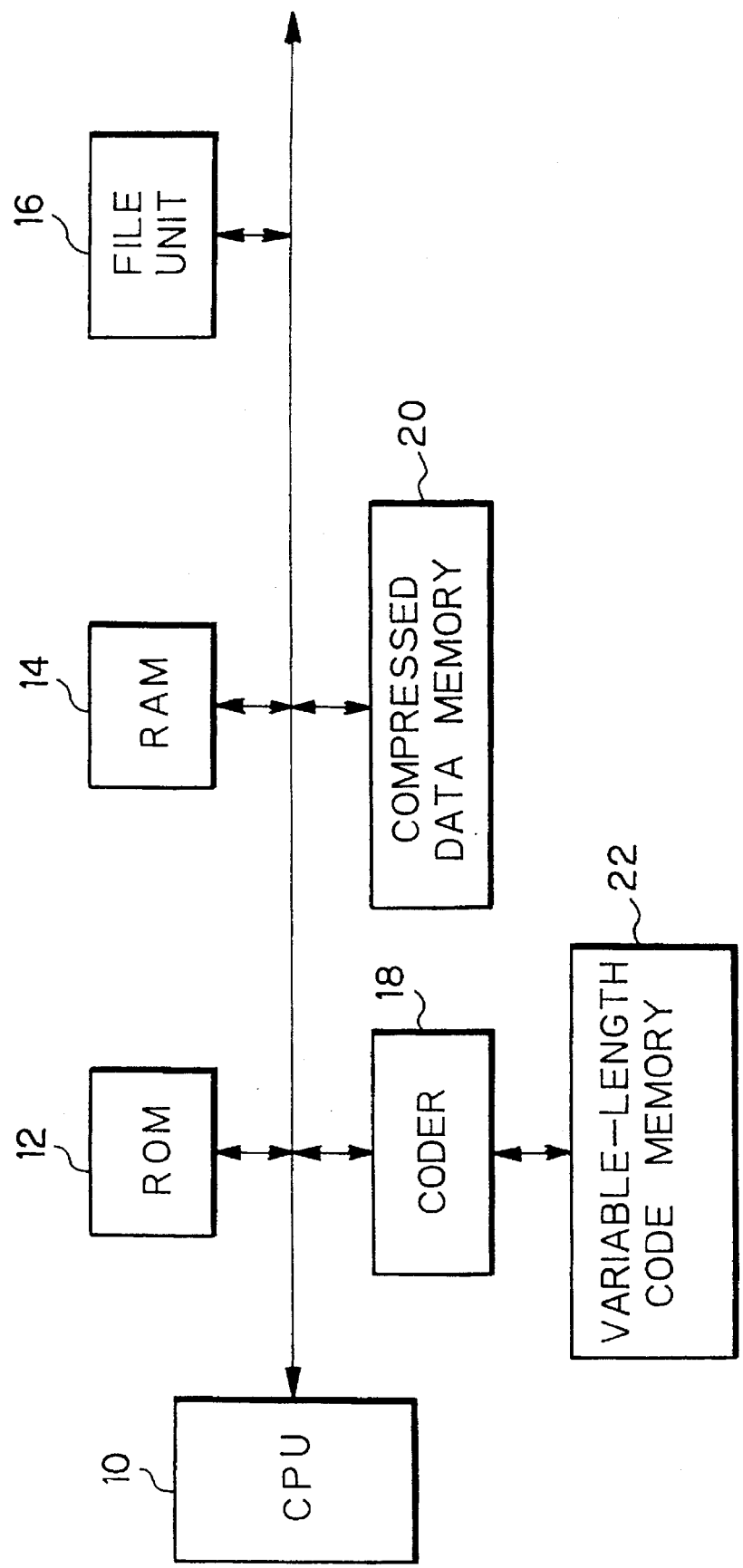
FIG. 3 is a block diagram schematically showing a variable-length coding device embodying the present invention.

Referring to FIG. 3, a variable-length coding device embodying the present invention will be described. As shown, the device has a CPU (Central Processing Unit) 10, a ROM (Read Only Memory) 12, storing a program, and a RAM (Random Access Memory) 14. The CPU 10 executes the program stored in the ROM 12 by using the RAM 14 as a work area. A file unit 16 stores video data to be compressed. The CPU 10 accesses the file unit 16 to read a portion of video data therefrom, transforms it into a corresponding variable-length code with a coder 18, and then writes the coded data to a compressed data memory 20, beginning at the next write address. The reference numeral 22 designates a variable-length code memory.

FIG. 4 shows an example of some of the specific data stored in the variable-length code memory 22 in accordance with the invention. As shown, a remainder counter R, an output counter C, and a variable-length code field are assumed to have four bits, four bits, and ten valid bits, respectively. [XXXXXXXXXX] represents the ten valid bits of a variable-length code having the bit pattern which corresponds to the portion of video data. The predefined entries of the variable-length code memory 22 are made by sequentially shifting the bit pattern by zero to seven bits in order from the top to the bottom. In the figure, each "X" represents one of the ten valid binary data bits, i.e., ZERO or ONE. The remainder counter R indicates, when the bit pattern is divided into bytes, the number of valid data bits [X] existing in the last byte of the pre-shifted variable length code. The output counter C shows how many bytes of saturate combined data (i.e., bytes of combined data not having any invalid data) are obtainable when the remaining data and the pre-shifted variable-length code field are ORed. More specifically, the output counter C shows which is the last byte of the combined data that will have valid data in the least significant bit (LSB) thereof.

Figure 5:
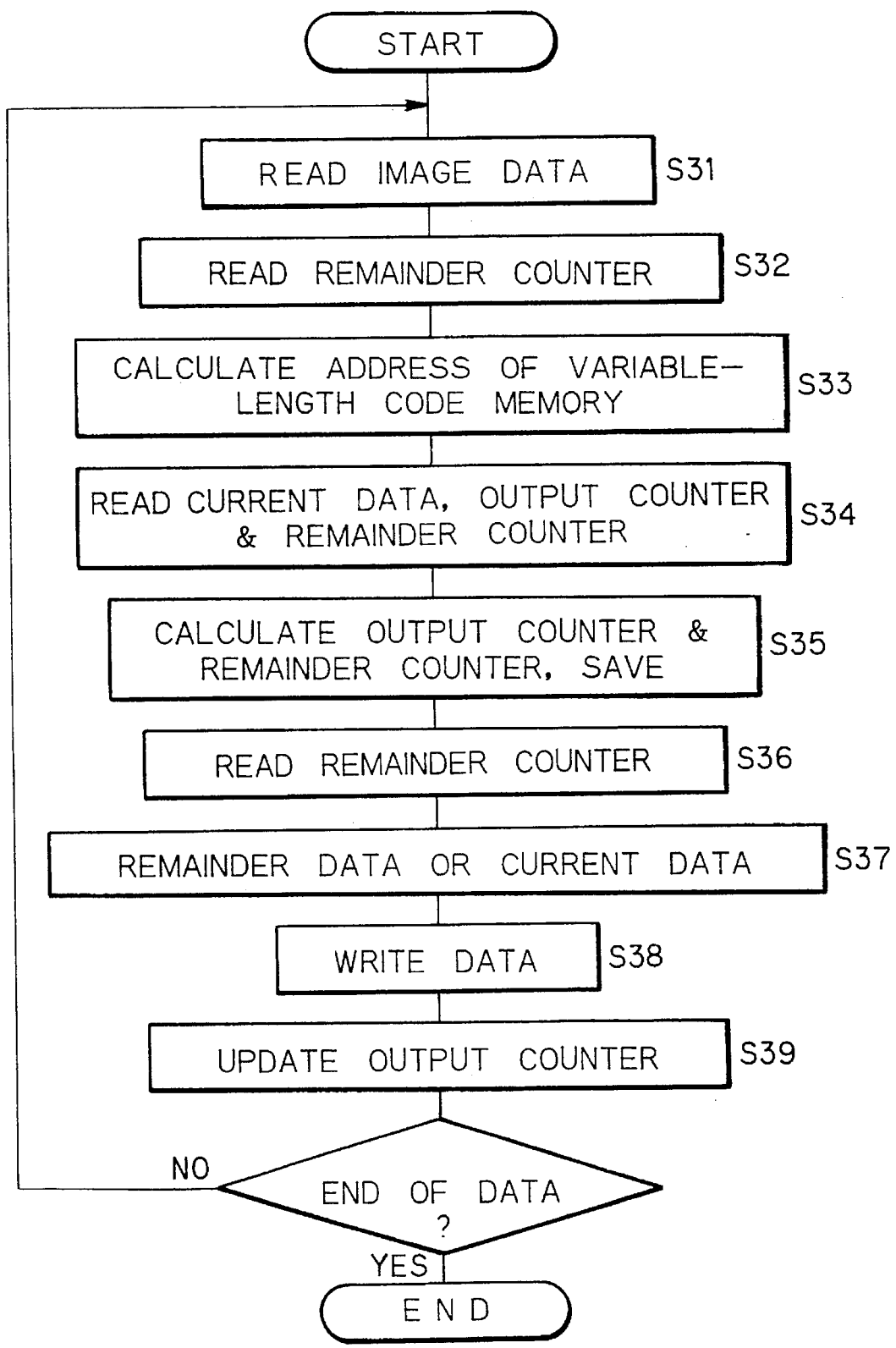
FIG. 5 is a flowchart representing a specific operation of the embodiment.

The operation of the CPU 10 will be described with reference to FIG. 5 and by taking the data shown in FIGS. 1 and 4 as an example. First, the CPU 10 reads video data out of the file unit 16 (step S31). The count of the remainder counter R is "3", as derived from the data at the next write address of content of the compressed data memory 20 (step S32). The CPU 10 calculates the correct address of the corresponding pre-shifted variable-length code in memory 22 from the video data and the count of the remainder counter R (step S33) and then reads out of the memory 22 the entire data entry [000XXXXX XXXXX000 00000000 00010101]as shown in FIG. 4 (step S34). Subsequently, the CPU 10 saves the value "1" of the corresponding output counter C and the value "5" of the corresponding remainder counter R in registers thereof, and then produces a variable-length code (000XXXXX XXXXX000 00000000) corresponding to the current data (step S35). Then, the CPU 10 reads the remaining data (AAA00000), FIG. 1, out of the next write address of the compressed data memory 20 (step S36). Here, "A" represents valid, already stored, compressed binary data, i.e., ZERO or ONE. The CPU 10 ORs the remaining data and the first byte (000XXXXX) of the current combined data (step S37). As a result, data [AAAXXXXX XXXXX000 00000000] is produced. The CPU 10 writes this combined data in the compressed data memory 20 (step S38) beginning at the next write address.

Subsequently, the CPU 10 adds the count "1" of the output counter C to a variable representing the next write address of the compressed data memory 20 (step S39), thereby showing that one byte of data has been updated. At the beginning of the next operation or loop, the CPU 10 recognizes the data [XXXXX000]of the second byte of the current data as remaining data and sees, based on the value "5" of the remainder counter R, that data of the zero-th bit to the fourth bits are valid.

In summary, it will be seen that the present invention provides a variable-length coding device capable of producing compressed data by effecting ORing only once without regard to the length of a variable-length code, thereby reducing the processing time to a noticeable degree. Further, since the present invention performs coding on a byte basis in place of the conventional bit basis, it can deal with the address of a compressed data memory with ease and, therefore, can code video data at high speed.

Various modifications will become possible for those skilled in the art, after receiving the teachings of the present disclosure, without departing from the scope thereof.

What is claimed is:

1. A variable-length coding device for compressing video data, comprising:
    a variable-length code memory for storing pre-shifted versions of variable-length codes in respective entries, each of said entries having:
        a code field containing a predetermined code value corresponding to one of said variable-length codes shifted zero or more times,
        an output count field containing an output count value corresponding to the byte number of a last saturated byte of said code value, and
        a remainder count field containing a remainder count value corresponding to the number of valid bits in a last valid byte of said code value; and
    a processor for performing a current write operation by writing combined data to a next write address of a compressed data memory, said next write address having remainder data;

said combined data being a logical combination of said remainder data and one of said entries, said one of said entries being selected on the basis of said remainder data and one of said variable-length codes;

said one of said variable-length codes corresponding to video input data;

said output count value of said entry indicating a subsequent next write address for a subsequent write operation;

said remainder count value indicating said remainder data for said subsequent write operation.

2. In a variable-length coding device for coding video data, a method of storing a selected one of a set of variable-length codes in a compressed data memory, said method comprising the steps of:

shifting said codes to populate entries in a variable-length code memory; then selecting said selected one of said codes;

determining remainder data of a next write address of said compressed data memory;

reading one of said entries from said variable-length code memory to provide current data, wherein said one of said entries has an address determined on the basis of said selected one of said codes and said remainder data;

combining, in a logical OR operation, said current data with said remainder data to produce combined data; and writing said combined data at said next write address;

wherein said current data is not shifted.

3. The method as set forth in claim 2, further comprising the step of:

incrementing said next write address by an output count, wherein said output count is contained in said one of said entries.

4. The method as set forth in claim 2, wherein:

said determining step determines said remainder data from a remainder count contained in a previously-read one of said entries.

* * * * *